(12) United States Patent
Pekny et al.

(10) Patent No.: US 6,925,011 B2
(45) Date of Patent: Aug. 2, 2005

(54) PROGRAMMING FLASH MEMORIES

(75) Inventors: Theodore T. Pekny, Milpitas, CA (US); Steve Gualandri, Campbell, CA (US)

(73) Assignee: Micron Technology, Inc., Boise, ID (US)

(*) Notice: Subject to any disclaimer, the term of this patent is extended or adjusted under 35 U.S.C. 154(b) by 160 days.

(21) Appl. No.: 10/329,792

(22) Filed: Dec. 26, 2002

(65) Prior Publication Data
US 2004/0125654 A1 Jul. 1, 2004

(51) Int. Cl.[7] ............................................. G11C 11/34
(52) U.S. Cl. .................... 365/185.28; 365/226
(58) Field of Search ............................. 365/185.28, 226

(56) References Cited

U.S. PATENT DOCUMENTS 5,764,571 A * 6/1998 Banks .................. 365/189.01
5,991,221 A * 11/1999 Ishikawa et al. ............ 365/226
6,288,419 B1    9/2001 Prall et al.
2002/0126537 A1 9/2002 Kreifels et al.

* cited by examiner

Primary Examiner—Michael Tran
(74) Attorney, Agent, or Firm—Leffert Jay & Polglaze, PA

(57) ABSTRACT

A method for programming a memory cell is provided that includes detecting a program command at the memory device and detecting an external voltage applied to the memory device that exceeds a predetermined value. The method includes, in response to the program command and the detected external voltage, applying an internally generated programming voltage to a control gate of the memory cell. Applying a voltage pulse to a drain of the memory cell while the control gate is at the internally generated programming voltage is also included in the method.

38 Claims, 6 Drawing Sheets

PROGRAMMING FLASH MEMORIES

TECHNICAL FIELD

The present invention relates generally to the field of flash memories.

BACKGROUND

A flash memory device is a type of electrically erasable programmable read-only memory (EEPROM) and is used for non-volatile storage of data. Flash memory is being increasingly used to store execution codes and data in portable electronic products, such as computer systems.

A typical flash memory comprises a memory array having rows and columns of memory cells. Each of the memory cells is fabricated is a field-effect transistor having a control gate and a floating gate. The floating gate is capable of holding a charge and is separated by a thin oxide layer from source and drain regions contained in a substrate. Each of the memory cells can be electrically programmed (charged) by injecting electrons from the drain region through the oxide layer onto the floating gate. The charge can be removed from the floating gate by tunneling the electrons to the source through the oxide layer during an erase operation. Thus, the data in a memory cell is determined by the presence or absence of a charge on the floating gate.

Typically, the control gate of each memory cell of a row of the array is connected to a line (called a word-line) having a common voltage (word-line voltage), and the drain region of each memory cell of a column of the array is connected to a line (called a bit-line) having a common voltage (bit-line voltage). Flash memories currently have a typical operating voltage (Vcc) in the range of about 1.5 to 5 volts. A high voltage (or programming voltage), however, is usually required for programming and erase operations in a flash memory. This high voltage is often 8 volts or higher. During a programming operation, electrons may be injected onto the floating gate by applying the high voltage to the control gate, e.g., via the word-line, and about one-half of the high voltage to the drain region, e.g., via the bit-line, while the source region is grounded. Other mechanisms for adding or removing charge from the floating gate are also known.

In many applications, programming a flash memory cell includes pumping lip the voltage at the control gate (word-line voltage) to a to a program-verify or read voltage, e.g., at or slightly above a threshold voltage (Vt) of an erased cell, using a charge pump. When the word-line voltage reaches the program-verify voltage, a program-verify is performed to determine if the memory cell is programmed. This usually involves sensing a current of the cell. For example, if the cell current is above a reference value, indicating that the Vt of the cell is below that of a programmed cell, the cell is not programmed. If the cell current is below the reference value, indicating that the Vt of the cell is above that of an erased cell, the cell is programmed.

If the cell is not programmed, the algorithm enters a program mode, and the charge pump pumps the word-line voltage from the program-verify voltage to the programming voltage, while another charge pump pumps the voltage at the drain region (bit-line voltage) from about zero to about half the word-line voltage, initiating programming of the cell. However, the rise time of the word-line voltage in going from the program-verify voltage to the programming voltage is relatively long because the charge pump is typically designed to initially pump the word-line voltage to the program-verify voltage relatively slowly to avoid overshooting the program-verify voltage. This increases the programming time because the rate of programming is reduced during the rise time due to the relatively low voltages during early parts of the rise time.

In some applications, programming times can be reduced by using a high external programming voltage (Vpp), e.g., about 12 volts. For example, during manufacturing, Vpp is applied to the word-line without using a charge pump to reduce the rise time and thus the programming time. Vpp is also regulated down and applied to the bit-line for supplying the bit-line voltage. However, many flash-memory programming processes do not support an external Vpp. Moreover, using a high Vpp can sometimes cause various internal circuits of the flash memory to break down.

For the reasons stated above, and for other reasons stated below that will become apparent to those skilled in the art upon reading and understanding the present specification, there is a need in the art for alternatives for programming flash memory cells.

SUMMARY

One embodiment of the present invention provides a method for programming a floating-gate memory cell of a memory device. The method includes detecting a program command at the memory device and detecting an external voltage applied to the memory device that exceeds a predetermined value. The method includes, in response to the program command and the detected external voltage, applying an internally generated programming voltage to a control gate of the memory cell. Applying a voltage pulse to a drain of the memory cell while the control gate is at the internally generated programming voltage is also included in the method.

Another embodiment provides a method for programming a floating-gate memory cell of a memory device. The method includes detecting a program command at the memory device and detecting an external voltage applied to the memory device that exceeds a predetermined value. The method includes, in response to the program command and the detected external voltage, pumping a voltage at a control gate of the memory cell directly to a programming voltage from a first voltage level without stopping at an intermediate voltage level. Applying a voltage pulse to a drain of the memory device while the voltage at the control gate is at the programming voltage for programming the memory cell is also included in the method.

Another embodiment provides a method for programming a floating-gate memory cell of a memory device. The method includes detecting an external voltage at the memory device. The method includes, when the external voltage is less than or equal to a predetermined voltage, applying a program-verify voltage to a control gate of the memory cell, determining whether the memory cell is programmed, and, if the memory cell is not programmed, applying an internally-generated programming voltage to the control gate while applying a voltage pulse to a drain of the memory cell or, if the memory cell is programmed, discharging the control gate. The method includes, when the external voltage is greater than the predetermined voltage, applying the internally-generated programming voltage to the control gate and applying the voltage pulse to drain while the control gate is at the internally-generated programming voltage prior to determining whether the memory cell is programmed.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1:
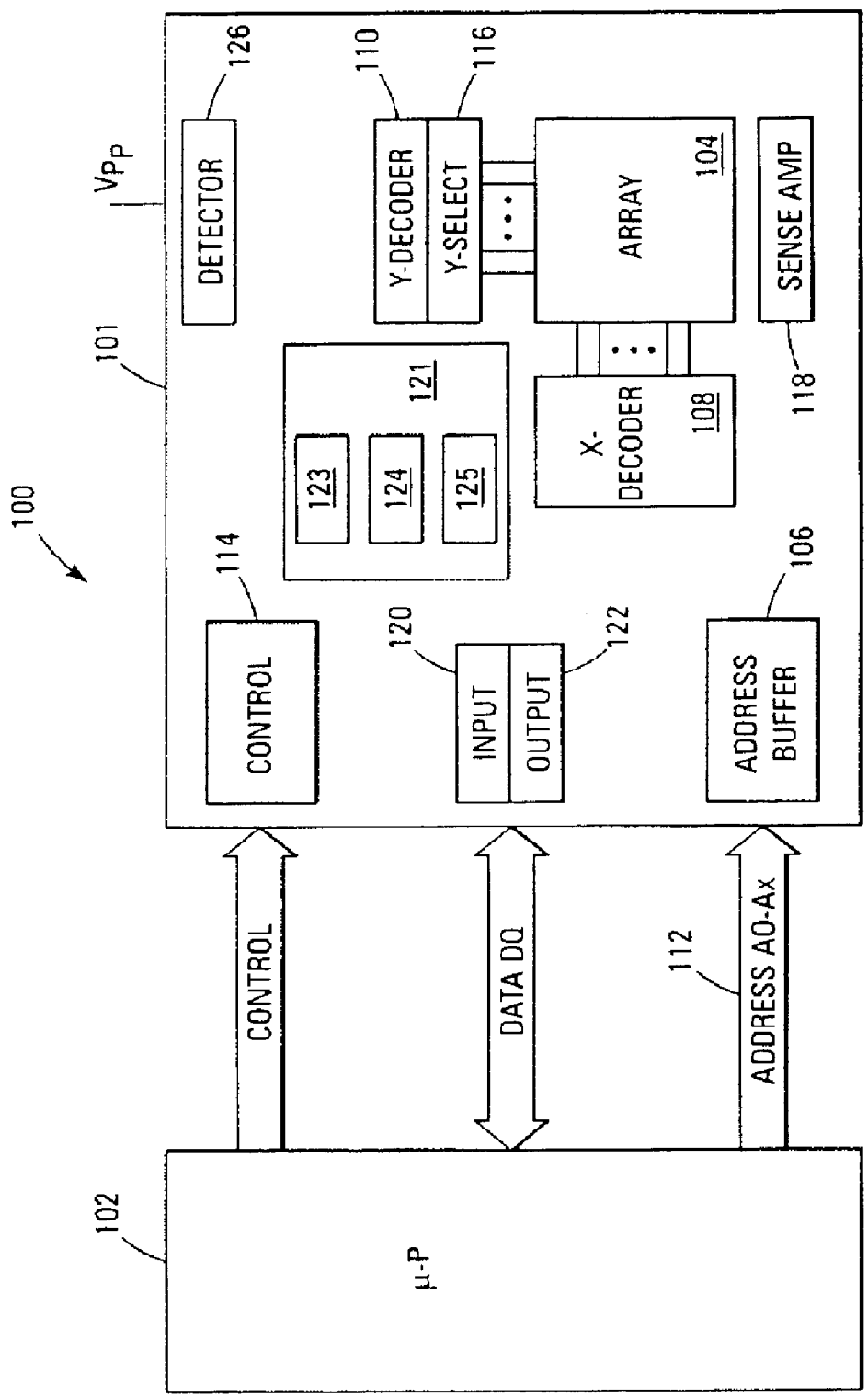
FIG. 1 is a flash memory system according to an embodiment of the present invention.

FIG. 1 is a block diagram of a flash memory system 100 according to an embodiment of the present invention. Flash memory system 100 includes a flash memory device 101 coupled to a processor or data controller 102. The memory system has been simplified to focus on features of the memory that are helpful in understanding the invention.

Memory device 101 includes an array 104 of flash memory cells. The array is arranged in rows and columns, with the rows arranged in blocks. The blocks allow memory cells to be erased in large groups, or bytes. Data, however, can be stored in the memory array in small data groups (byte or group of bytes) separate from the block structure. Erase operations are typically performed on a large number of cells in parallel.

An x-decoder (or row decoder) 108 and a y-decoder (or column decoder) 110 are provided to decode address signals provided on address lines 112. Address signals are received and decoded to access the memory array 104. An address buffer circuit 106 is provided to latch the address signals. A y-select circuit 116 is provided to select a column of the array identified with the y-decoder 110. Sense amplifier and compare circuitry 118 is used to sense data stored in the memory cells and verify the accuracy of stored data. A data input buffer circuit 120 and a data output buffer circuit 122 are included for bi-directional data communication over a plurality of data (DQ) lines with the controller 102. Command control circuit (or command state machine) 114 decodes signals provided on control lines from the controller 102 and controls access to the memory cells of array 104. These signals are used to control the operations of the memory, including data read, data write, and erase operations. In one embodiment, flash memory device 101 includes a charge circuit 121 that generates internal voltages used during programming of the memory cells and other internal operations. In another embodiment, charge circuit 121 includes charge pumps 123, 124, and 125. In another embodiment, flash memory device 101 includes a detector 126 for detecting external voltages, such as an externally supplied Vpp, for triggering programming of the memory cells.

Figure 2:
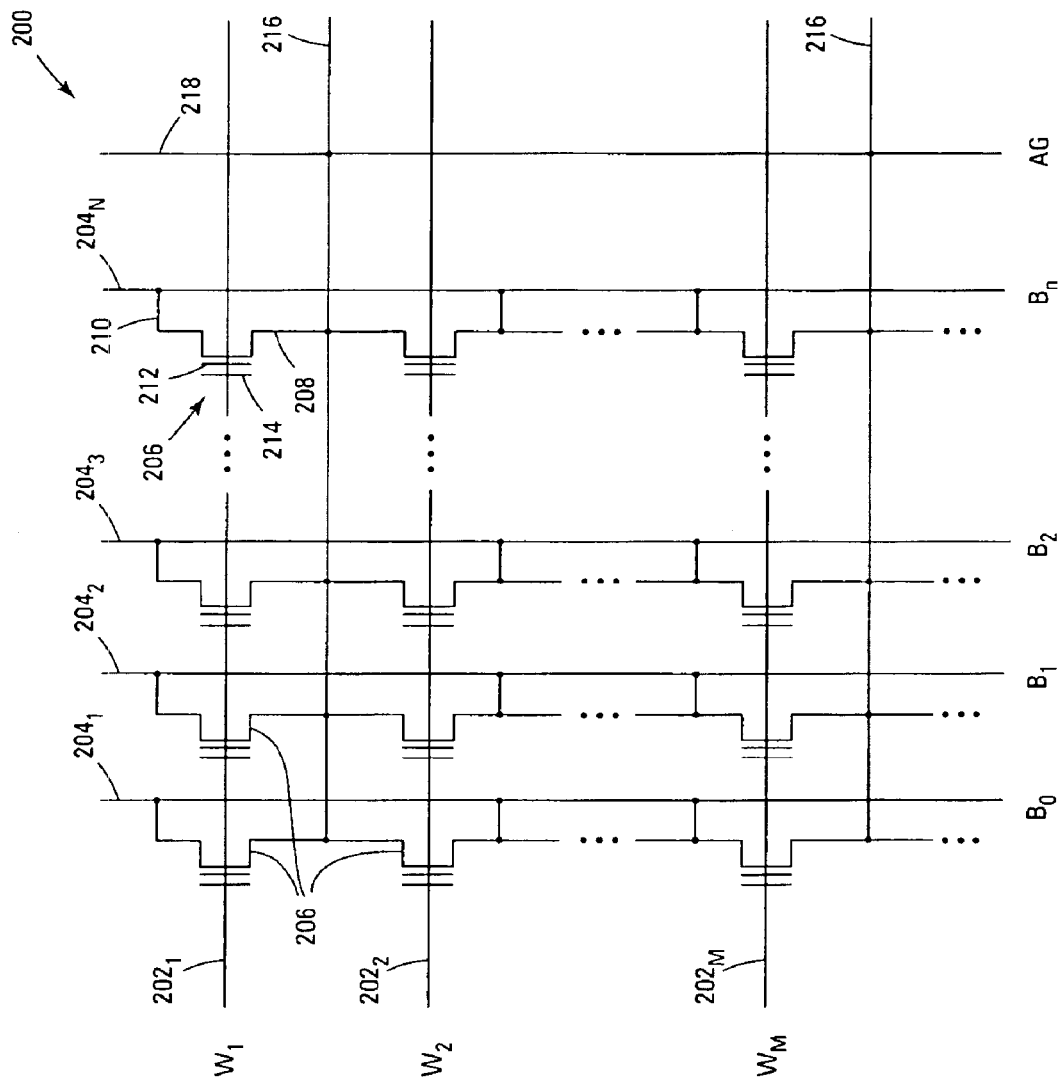
FIG. 2 is a schematic of a portion of a memory block of the flash memory system of FIG. 1 according to another embodiment of the present invention.

FIG. 2 is a schematic of a portion of a non-volatile memory block 200 as a portion of memory array 104 in accordance with another embodiment of the invention. Arrays of non-volatile memory cells are often configured as floating gate transistors placed at the intersection of word-lines and bit-lines. The word-lines are coupled to control gates of the floating gate transistors, and the bit-lines are coupled to drains of the floating gate transistors.

The detail of memory block 200 is provided to better understand the various embodiments of the invention. However, the invention is not limited to the specific floating-gate memory cell and layout described with reference to FIG. 2.

As shown in FIG. 2, the memory block 200 includes word-lines $202_1$ to $202_M$ and intersecting local bit-lines $204_1$ to $204_N$. For ease of addressing in the digital environment, the number of word-lines 202 and the number of bit-lines 204 are each some power of two, e.g., 256 word-lines 202 by 4,096 bit-lines 204. The local bit-lines 204 are coupled to global bit-lines (not shown in FIG. 2) in a many-to-one relationship.

Floating gate transistors 206 are located at each intersection of a word-line 202 and a local bit-line 204. The floating gate transistors 206 represent the non-volatile memory cells for storage of data. Typical construction of such floating gate transistors 206 include a source 208 and a drain 210 constructed from an $N^+$-type material of high impurity concentration formed in a P-type semiconductor substrate of low impurity concentration, a channel region formed between the source 208 and drain 210, a floating gate 212, and a control gate 214. Floating gate 212 is isolated from the channel region by a tunneling dielectric and from the control gate 214 by an interlayer dielectric. The materials of construction are not critical to the invention, but commonly include doped polysilicon for the gate materials, and silicon oxides, nitrides or oxynitrides for the dielectric materials.

Floating gate transistors 206 having their control gates 214 coupled to a word-line 202 typically share a common source 208 depicted as array source 216. As shown in FIG. 2, floating gate transistors 206 coupled to two adjacent word-lines 202 may share the same array source 216. Floating gate transistors 206 have their drains 210 coupled to a local bit-line 204. A column of the floating gate transistors 206 are those transistors commonly coupled to a given local bit-line 204. A row of the floating gate transistors 206 are those transistors commonly coupled to a given word-line 202.

To reduce problems associated with high resistance levels in the array source 216, the array source 216 is regularly coupled to a metal or other highly conductive line to provide a low-resistance path to ground. The array ground 218 serves as this low-resistance path.

To program one or more of memory cells 206, in one embodiment, command control circuit 114 decodes a program command received from data controller 102. This latches data to be programmed. In another embodiment, when detector 126 detects an external voltage, such as an externally-supplied Vpp, that is less than or equal to a predetermined value, e.g., about 5 volts, and the program command is issued, control circuit 114 causes flash memory device 101 to perform a conventional method, such as method 300 of FIG. 3, for programming a memory cell 206. When detector 126 detects an external voltage greater than the predetermined value (a high external voltage) and the program command is issued, control circuit 114 causes flash memory device 101 to perform method 500 of FIG. 5 for programming the memory cell 206.

In some first-generation memory devices, the high external voltage is applied to the control gates of a memory cell of an array of memory cells of the memory device for programming the cell during manufacturing. In this respect, flash memory device 101 is backward compatible with the first-generation memory devices because it can accept the high external voltage. However, memory device 101 uses the high external voltage to trigger programming of a memory cell of flash memory device 101 according to method 500, which substitutes an internal programming voltage for the high external voltage for programming the memory cell.

Figure 3:
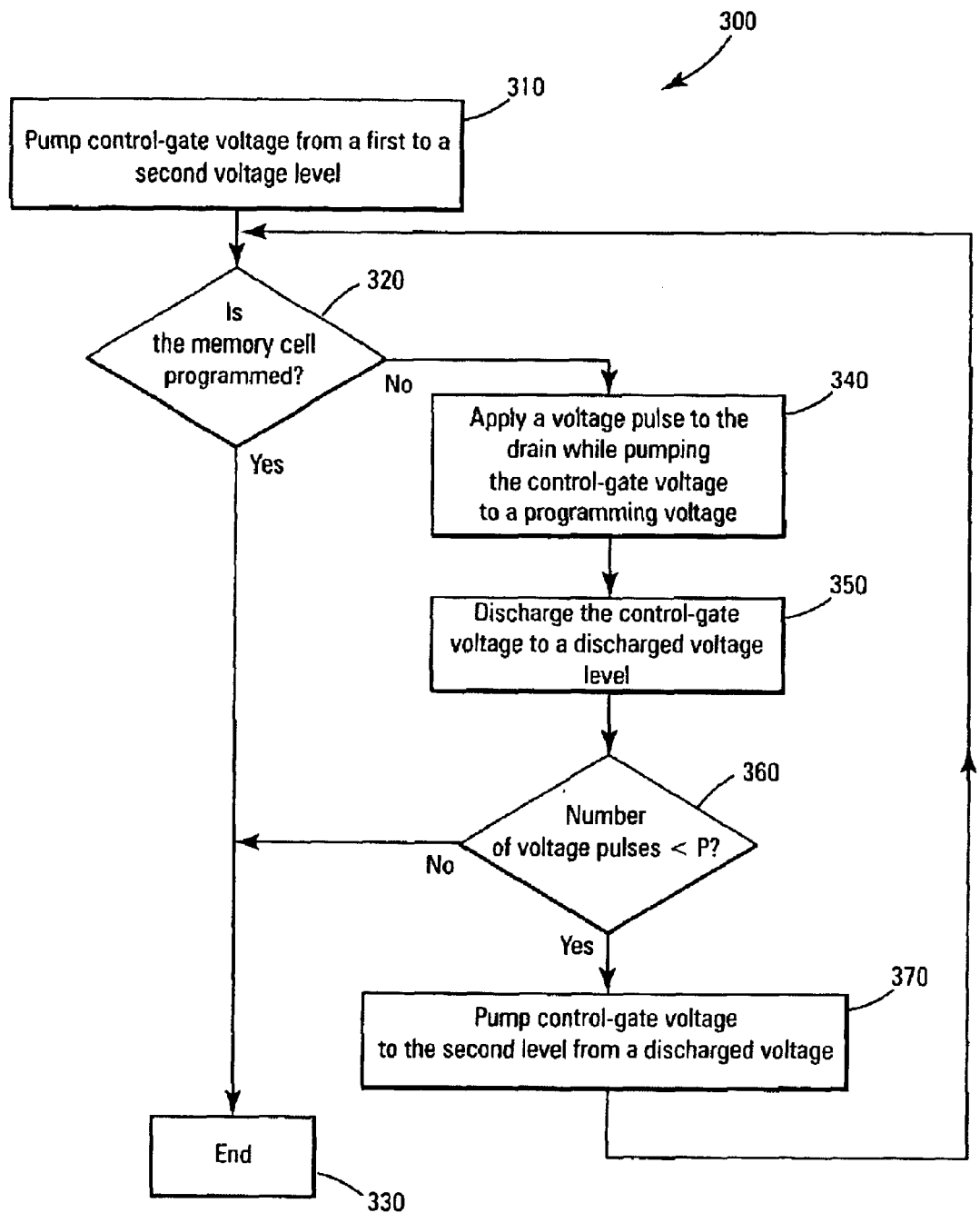
FIG. 3 is a flow chart of a conventional method for programming a flash memory cell of the memory block of FIG. 2.

FIG. 3 is a flowchart of method 300 according to one embodiment of the present invention. At block 310, charge pump 123, for example, pumps a voltage at a control gate 214 of the memory cell 206 from a first voltage level to a second voltage level via a corresponding one of word-lines $202_1$ to $202_M$. For one embodiment, the first voltage level corresponds to an operating voltage (Vcc), ground (Vss), or the like, and the second voltage level corresponds to a program-verify or read voltage, e.g., at or slightly above a threshold voltage (Vt) of an erased cell. Pumping of the control gate (or word-line) voltage, for one embodiment, is illustrated by a solid line 402 of a plot 400 of the control-gate voltage versus time in FIG. 4. Solid line 402 shows that the control-gate voltage increases from a voltage level 404, at a time $t_1$, to a voltage level 406, at a time $t_2$. In one embodiment, voltage level 404 is a Vcc of about 1.8 volts, as shown, and voltage level 406 is a program-verify or read voltage at or slightly above a Vt of an erased cell, e.g., about 6.5 volts, as shown.

At decision block 320, with the control-gate voltage at voltage level 406, it is determined whether the memory cell 206 is programmed. In other words, a program-verify is performed at block 320. For one embodiment, this is accomplished by comparing the current of the memory cell 206 to a reference current using sense amplifier and compare circuitry 118. In one embodiment, when the current of the memory cell 206 is greater than the reference current, indicating that the Vt of the memory cell 206 is below that of a programmed cell, the memory cell 206 is not programmed. When the memory cell 206 is not programmed, a voltage pulse is applied to a drain 210 of the memory cell 206 while the control-gate voltage is pumped from the second voltage level to a programming voltage at block 340.

Figure 4:
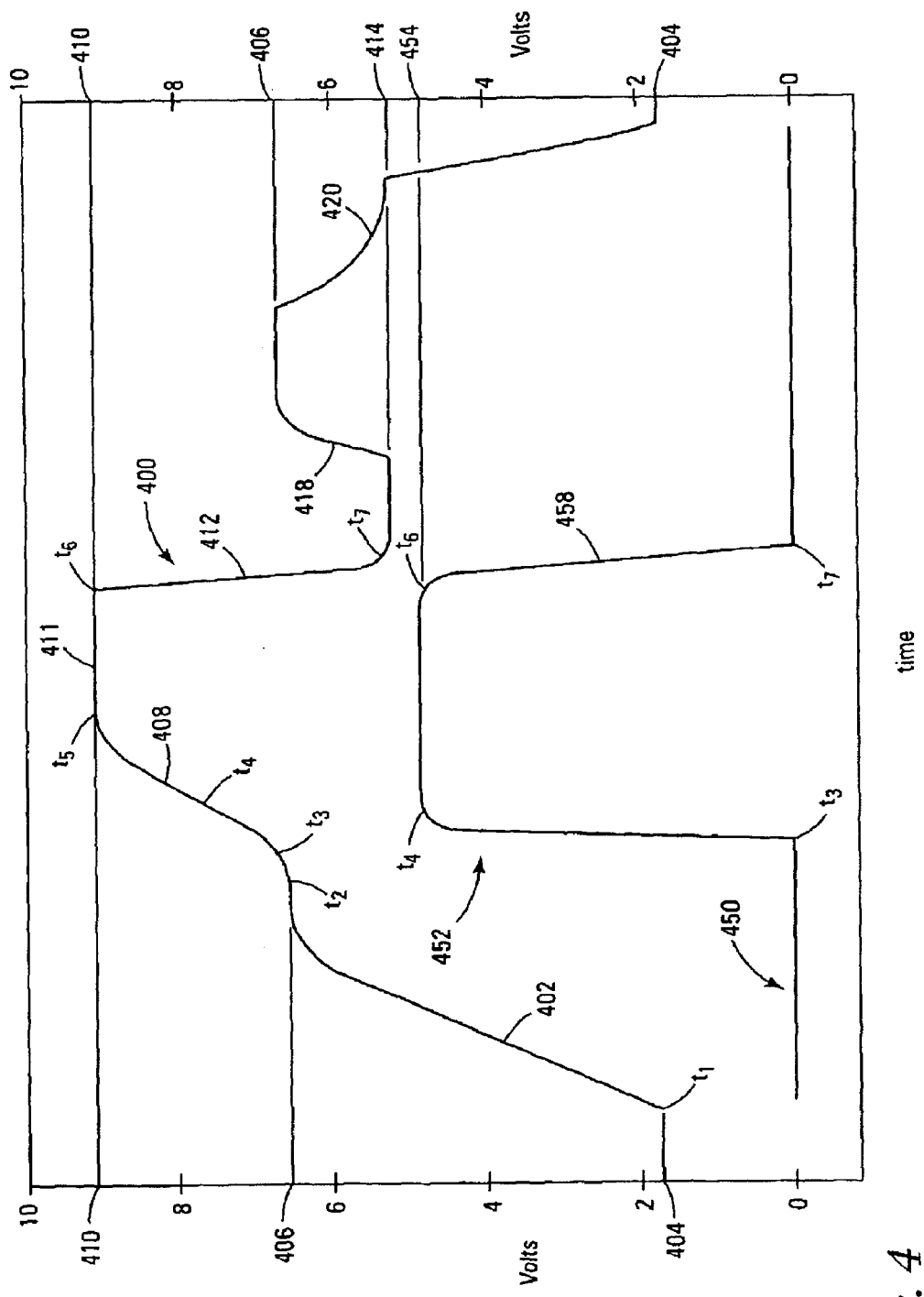
FIG. 4 is a plot illustrating voltages applied to the flash memory cell during the method of FIG. 3.

A solid line 408 of plot 400 in FIG. 4, extending between a time $t_3$ and a time $t_5$, illustrates the control-gate voltage as the control-gate voltage is pumped from a second level to the programming voltage. In particular, the control-gate voltage is pumped from voltage level 406 at time $t_3$ to a programming voltage 410, e.g., about 9 volts, at time $t_5$. Subsequently, the control-gate voltage remains at programming voltage 410 until a time $t_6$, as illustrated by solid line 411.

FIG. 4 also includes a plot 450 of a voltage applied to drain 210 versus time. Plot 450 includes a voltage pulse 452 that in one embodiment is applied to drain 210 from time $t_3$ to a time $t_7$. In particular, for one embodiment, charge pump 124, for example, pumps the drain voltage from a voltage level of about zero volts to a voltage level 454 at a time $t_4$. In another embodiment, voltage level 454 is about half of programming voltage 410, e.g., about 4.5 volts, as shown. The drain voltage remains at voltage level 454 until time $t_6$. When the drain voltage reaches voltage level 454 at time $t_4$, for various embodiments, programming of the memory cell 206 commences and proceeds until time $t_6$.

At block 350, the control-gate voltage is discharged from the programming voltage to a discharged voltage level, at time $t_7$, that is lower than the second voltage level. For one embodiment, the control-gate voltage is discharged from programming voltage 410 to a discharged voltage level 414, e.g., about 5 volts, that is lower than voltage level 406, as illustrated by a solid line 412 of plot 400. Moreover, the drain voltage is discharged from voltage level 454 to a voltage level of about zero volts, as illustrated by a solid line 458 of plot 450.

When the number of voltage pulses applied to the drain is less than a predetermined integer P, e.g., 3000, at decision block 360, method 300 proceeds to block 370. Otherwise, method 300 ends at block 330.

At block 370, the control-gate voltage is pumped from the discharged voltage level to the second voltage level. In particular, for one embodiment, the control gate voltage is pumped from discharged voltage level 414 to voltage level 406, as shown by solid line 418 of plot 400. Method 300 then returns to decision block 320, where it is determined whether the memory cell 206 is programmed, as described above. In one embodiment, when the current of the of the memory cell 206 is less than the reference current, indicating that the Vt of the memory cell 206 is above that of an erased cell, the memory cell 206 is programmed. When the memory cell 206 is programmed method 300 ends at block 330. For one embodiment, this corresponds to the control-gate voltage discharging from voltage level 406 to voltage level 404, as shown by solid line 420 of plot 400.

Figure 5:
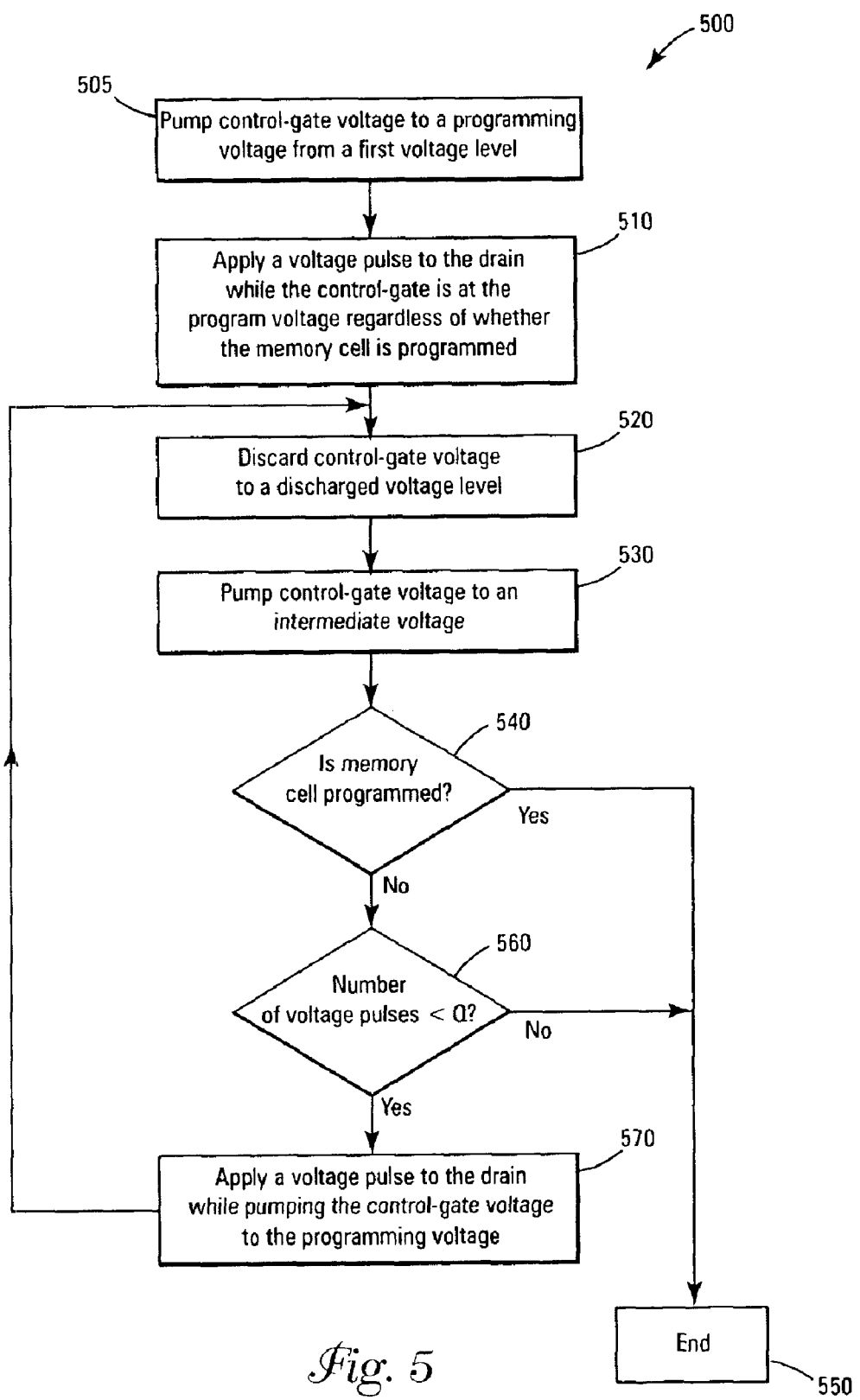
FIG. 5 is a flow chart of a method for programming a flash memory cell of the memory block of FIG. 2 according to yet another embodiment of the present invention.

FIG. 5 is a flowchart of method 500 according to one embodiment of the present invention. At block 505, charge pump 125, for example, pumps the control gate voltage directly to a programming voltage from a first voltage level without stopping at an intermediate voltage level, such as a program-verify voltage, for determining whether the memory cell 206 is programmed. This is illustrated, for one embodiment, by a solid line 602 of a plot 600 of the control-gate voltage (or word-line voltage) versus time in FIG. 6. Solid line 602 shows that the control-gate voltage increases from a voltage level 604, at a time $t'_1$, to a programming voltage 610, at a time $t'_2$. In one embodiment, voltage level 604 is Vcc, e.g., about 1.8 volts as shown, Vss, or the like, and programming voltage 610 is about 9 volts, as shown.

In another embodiment, charge pump 125 is set to charge up to a higher target voltage, i.e., the programming voltage, than charge pumps 123 and 124. This enables relatively fast pumping of the control-gate voltage from voltage level 604 to programming voltage 610. This is possible because overshooting the intermediate voltage is not a concern.

At block 510, a voltage pulse is applied to drain 210 of the memory cell 206 while the control-gate is at the programming voltage. In one embodiment, the voltage pulse is applied in response to a signal, e.g., from command control circuit 114, indicating that the memory cell 206 is not programmed, regardless of whether the memory cell 206 is in fact programmed. In one embodiment, this amounts to skipping the program-verify of method 300 after the control-gate voltage is pumped from voltage level 404 to voltage level 406, as shown in FIG. 4 for one embodiment of method 300.

Figure 6:
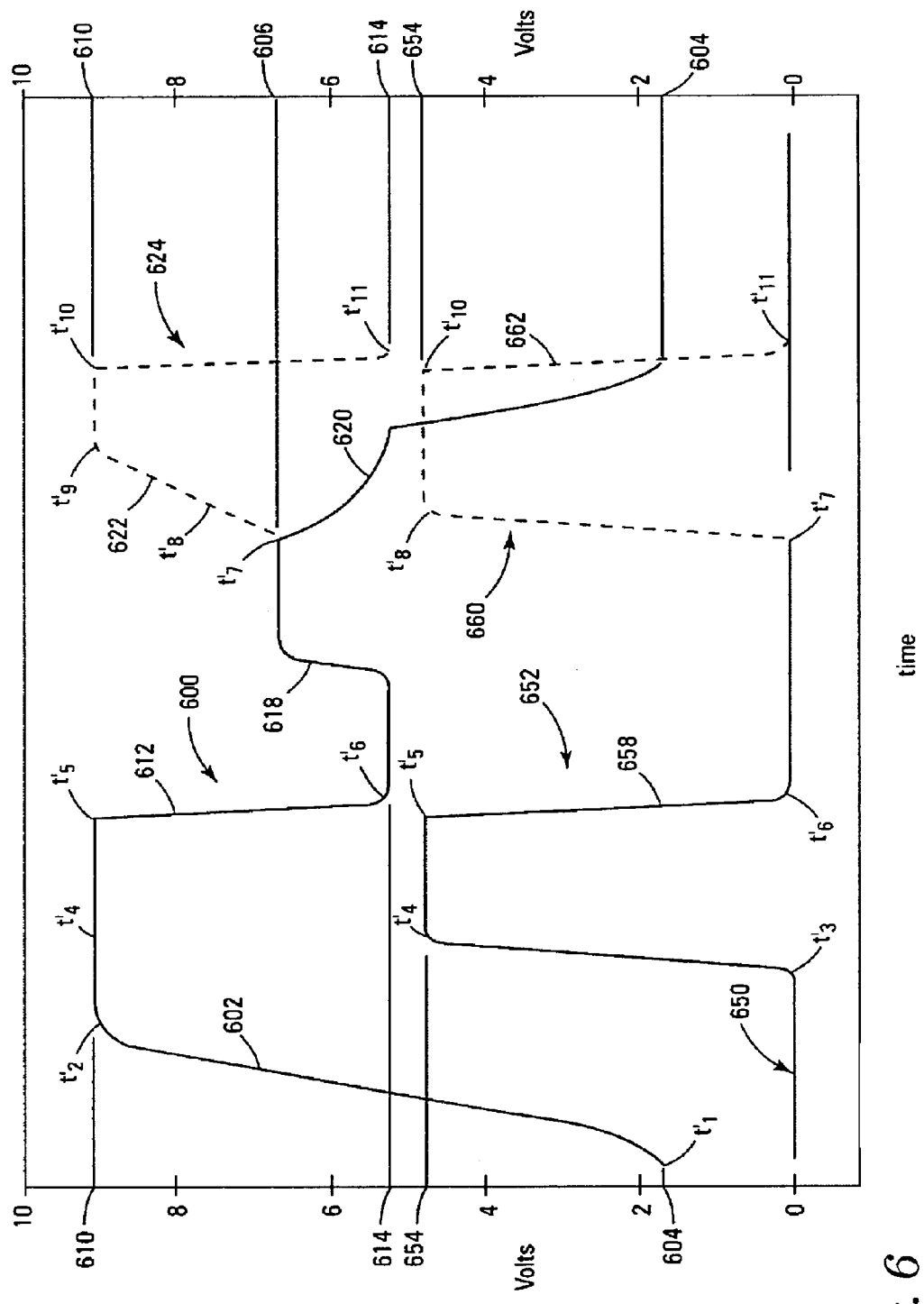
FIG. 6 is a plot illustrating voltages applied to the flash memory cell during the method of FIG. 5.

FIG. 6 also includes a plot 650 of a voltage applied to drain 210 versus time. Plot 650 includes a voltage pulse 652 that in one embodiment is applied to drain 210 from a time $t'_3$ to a time $t'_6$. In particular, for one embodiment, charge pump 124, for example, pumps the drain voltage from a voltage level of about zero volts to a voltage level 654 at a time $t'_4$. In another embodiment, voltage level 654 is about half of programming voltage 610, e.g., about 4.5 volts, as shown. The drain voltage remains at voltage level 654 until a time $t'_5$. When the drain voltage reaches voltage 454 at time $t'_4$, programming of the cell 206 commences and proceeds until time $t'_5$.

Throughout programming, the control-gate voltage is at programming voltage 610. This is in contrast to the control-gate voltage during conventional programming, as shown by solid line 408 in FIG. 4. It is seen that the control-gate voltage 400 is still being pumped during programming. During pumping, the control-gate voltages are relatively low, resulting in slower programming compared to when the control-gate voltage is at the programming voltage throughout programming, as in FIG. 6.

At block 520, the control-gate voltage is discharged from the programming voltage to a discharged voltage level. For one embodiment, the control-gate voltage is discharged from programming voltage 610 to a discharged voltage level 614, at time $t'_6$, e.g., about 5 volts, as illustrated by a solid line 612 of plot 600. Moreover, the drain voltage is discharged from voltage level 654 to a voltage level of about zero volts, as illustrated by a solid line 658 of plot 650.

At block 530, the control-gate voltage is pumped from the discharged voltage level to an intermediate voltage level, e.g., a program-verify or read voltage at or slightly above a Vt of an erased cell, between the discharged voltage level and the programming voltage. For example, in one embodiment, the control-gate voltage is pumped from discharged voltage level 614 to an intermediate voltage level 606 of about 6.5 volts, as shown by solid line 618 of plot 600.

With the control-gate voltage at the intermediate voltage level, method 500 proceeds to decision block 540, where it is determined whether the memory cell 206 is programmed. In other words, a program-verify is performed at block 540. For one embodiment, this is accomplished by comparing the current of the memory cell 206 to a reference current using sense amplifier and compare circuitry 118. In one embodiment, when the current of the of the memory cell 206 is less than the reference current, indicating that the Vt of the memory cell 206 is above that of an erased cell, the memory cell 206 is programmed. When the memory cell 206 is programmed, method 500 ends at block 550. In one embodiment, this corresponds to the control-gate voltage discharging from intermediate voltage level 606 to voltage level 604, as shown by solid line 620 of plot 600.

In one embodiment, when the current of the memory cell 206 is greater than the reference current, indicating that the Vt of the memory cell 206 is below that of a programmed cell, the memory cell 206 is not programmed. When the memory cell 206 is not programmed, method 500 proceeds to decision block 560. If the number of voltage pulses applied to the drain of the memory cell 206 is less than a predetermined integer Q. e.g., 3000, at decision block 560, method 500 proceeds to block 570. Otherwise, method 500 ends at block 550.

At block 570, a voltage pulse is applied to drain 210 of the memory cell 206 while the control-gate voltage is pumped from the intermediate voltage level to the programming voltage. For example, in one embodiment, a voltage pulse 660 is applied to drain 210 from a time $t'_7$ to a time $t'_{11}$, as shown in FIG. 6. In particular, for one embodiment, charge pump 124, for example, pumps the drain voltage from a voltage level of about zero volts to voltage level 654 at a time $t'_8$. The drain voltage remains at voltage level 654 until a time $t'_{10}$. A dashed line 622 in FIG. 6 illustrates for one embodiment that the control-gate voltage is pumped from intermediate voltage level 606 at time $t'_7$ to the programming voltage 610 at a time $t'_9$. When the drain voltage reaches voltage level 654 at time $t'_8$, programming of the cell 206 commences and proceeds until time $t'_{10}$.

Method 500 subsequently returns to block 520. At block 520, for one embodiment, the control-gate voltage is discharged to discharged voltage level 614, at time $t'_{11}$, as illustrated by a dashed line 624 of plot 600. Moreover, the drain voltage is discharged from voltage level 654 to about zero volts, as illustrated by a dashed line 662 of plot 650.

CONCLUSION

Embodiments of the present invention provide for programming a floating-gate memory cell of a memory device. In one embodiment, a programming command and an external voltage that exceeds a predetermined value are detected at the memory device. In response to the program command and the detected external voltage, a voltage at a control gate of the memory cell is pumped directly to a programming voltage from a first level without stopping at an intermediate voltage for performing a program verify to determine if the memory cell is programmed, as is done for conventional programming methods. A voltage pulse is applied to a drain of the memory cell while the control gate is at the programming voltage for programming the memory cell irrespective of whether the memory cell is programmed. Pumping the control-gate voltage directly to the programming voltage and applying the voltage pulse to the drain while the control gate is at the programming voltage reduces the programming time compared to conventional methods where a program verify is performed at the intermediate voltage and the voltage pulse is applied to the drain while the control-gate voltage is pumped from the intermediate voltage to the programming voltage if the memory cell is not programmed.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method for programming a floating-gate memory cell of a memory device, the method comprising:
   detecting a program command at the memory device;
   detecting an external voltage applied to the memory device that exceeds a predetermined value;
   in response to the program command and the detected external voltage, applying an internally-generated programming voltage to a control gate of the memory cell; and
   applying a voltage pulse to a drain of the memory cell while the control gate is at the internally-generated programming voltage.

2. The method of claim 1, further comprising determining whether the memory cell is programmed.

3. The method of claim 2, wherein determining whether the memory cell is programmed comprises removing the voltage pulse from the drain and applying a program-verify voltage to the control gate after removing the voltage pulse from the drain.

4. The method of claim 3, further comprising, after determining whether the memory device is programmed, applying another voltage pulse to the drain while applying another programming voltage to the control gate if the memory device is not programmed.

5. The method of claim 3, wherein determining when the memory cell is programmed further comprises comparing a current of the memory cell to a reference current.

6. A method for programming a floating-gale memory cell of a memory device, the method comprising:
   detecting a program command at the memory device;
   detecting an external voltage applied to the memory device that exceeds a predetermined value;
   in response to the program command and the detected external voltage, pumping a voltage at a control gate of the memory cell directly to a programming voltage from a first voltage level without stopping at an intermediate voltage level; and
   applying a voltage pulse to a drain of the memory device while the voltage at the control gate is at the programming voltage for programming the memory cell.

7. The method of claim 6, further comprising discharging the voltage at the control gate from the programming voltage to a discharged voltage level and removing the voltage pulse from the drain.

8. The method of claim 7, further comprising pumping the voltage at the control gate from the discharged voltage level to the intermediate voltage level.

9. The method of claim 8, further comprising determining whether the memory cell is programmed while the control gate is at the intermediate voltage level.

10. The method of claim 9, further comprising discharging the voltage at the control gate to the first voltage level from the intermediate voltage level if the memory device is programmed.

11. The method of claim 9, further comprising applying another voltage pulse to the drain while pumping the voltage at the control gate from the discharged voltage level to the programming voltage if the memory device is not programmed.

12. A method for programming a floating-gate memory cell of a memory device, the method comprising:
   detecting a program command at the memory device;
   detecting an external voltage applied to the memory device that exceeds a predetermined value;
   in response to the program command and the detected external voltage, pumping a voltage at a control gate of the memory cell directly to a programming voltage from a first voltage level without stopping at an intermediate voltage level;
   pumping a voltage at a drain of the memory device from a first drain voltage level to a second drain voltage level while the voltage at the control gate is at the programming voltage for programming the memory; and
   determining whether the memory cell is programmed.

13. The method of claim 12, wherein determining whether the memory cell is programmed comprises:
   discharging the voltage at the drain from the second drain voltage level to the first drain voltage level;
   discharging the voltage at the control gate from the programming voltage to a discharged voltage level; and
   pumping the voltage at the control gate from the discharged voltage level to the intermediate voltage level.

14. The method of claim 13, wherein determining whether the memory cell is programmed comprises comparing a current of the memory cell to a reference current at the intermediate voltage level while the drain voltage is at the first drain voltage level.

15. The method of claim 13, further comprising discharging the voltage at the control gate from the intermediate voltage level to the first voltage level if the memory device is programmed.

16. The method of claim 13, further comprising pumping the voltage at the drain from the first drain voltage level to the second drain voltage level while pumping the voltage at the control gate from the intermediate voltage level to the programming voltage if the memory device is not programmed.

17. A method for programming a floating-gate memory cell of a memory device, the method comprising:
   detecting an external voltage at the memory device;
   when the external voltage is less than or equal to a predetermined voltage, applying a program-verify voltage to a control gate of the memory cell, determining whether the memory cell is programmed, and, if the memory cell is not programmed, applying an internally-generated programming voltage to the control gate while applying a voltage pulse to a drain of the memory cell or, if the memory cell is programmed, discharging the control gate; and
   when the external voltage is greater than the predetermined voltage, applying the internally-generated programming voltage to the control gate and applying the voltage pulse to drain while the control gate is at the internally-generated programming voltage prior to determining whether the memory cell is programmed.

18. The method of claim 17, further comprising receiving a programming command at the memory device.

19. The method of claim 17, further comprising latching data to be programmed.

20. The method of claim 17, further comprising, when the external voltage is greater than the predetermined voltage, determining whether the memory cell is programmed after applying the internally-generated programming voltage.

21. The method of claim 20, wherein determining whether the memory cell is programmed, when the external voltage is greater than the predetermined voltage, comprises removing the voltage pulse from the drain and applying the program-verify voltage to the control gate after removing the voltage pulse from the drain.

22. A method for programming a floating-gate memory cell of a memory device, the method comprising:
   detecting an external voltage at the memory device;
   when the external voltage is less than a predetermined voltage, pumping a voltage at a control gate of the memory cell to a second voltage level from a first voltage level, determining whether the memory cell is programmed, and, if the memory cell is not programmed, pumping the voltage at the control gate from the second voltage level to a programming voltage while applying a voltage pulse to a drain of the memory cell or, if the memory cell is programmed, discharging the voltage at the control gate from the second voltage level to the first voltage level; and
   when the external voltage is greater than the predetermined voltage, pumping the voltage at the control gate of the memory cell directly to the programming voltage from the first voltage level without stopping at the second voltage level and applying the voltage pulse to the drain while the control gate is at the programming voltage.

23. The method of claim 22, further comprising receiving a programming command at the memory device.

24. The method of claim 22, further comprising latching data to be programmed.

25. The method of claim 22, further comprising, when the external voltage is greater than the predetermined voltage, determining whether the memory cell is programmed.

26. The method of claim 25, wherein determining whether the memory cell is programmed, when the external voltage is greater than the predetermined voltage, comprises:
removing the voltage pulse from the drain;
discharging the voltage at the control gate from the programming voltage to a discharged voltage level; and
pumping the voltage at the control gate from the discharged voltage level to the second voltage level.

27. A method for programming a floating-gate memory cell of a memory device, the method comprising:
detecting a program command at the memory device;
detecting an external voltage applied to the memory device that exceeds a predetermined value;
in response to the program command and the detected external voltage, pumping a voltage at a control gate of the memory cell directly to a programming voltage from a first voltage level without stopping at an intermediate voltage level to verify whether the memory cell is already programmed;
pumping a voltage at a drain of the memory device from a first drain voltage level to a second drain voltage level while the voltage at the control gate is at the programming voltage for programming the memory regardless of whether the memory cell is already programmed.

28. The method of claim 27, further comprising discharging the voltage at the control gate from the programming voltage to a discharged voltage level and removing the voltage pulse from the drain.

29. The method of claim 28, further comprising pumping the voltage at the control gate from the discharged voltage level to the intermediate voltage level.

30. The method of claim 29, further comprising determining whether the memory cell is programmed, after pumping the voltage at the control gate from the discharged voltage level to the intermediate voltage level, while the control gate is at the intermediate voltage level.

31. The method of claim 30, further comprising discharging the voltage at the control gate to the first voltage level from the intermediate voltage level if the memory device is programmed.

32. The method of claim 30, further comprising applying another voltage pulse to the drain while pumping the voltage at the control gate from the discharged voltage level to the programming voltage if the memory device is not programmed.

33. A method for programming a floating-gate memory cell of a second-generation memory device that is backward compatible with a first-generation memory device, the first-generation memory device having a floating-gate memory cell that is programmed by an external programming voltage applied to the first-generation memory device, the method comprising:
applying the external programming voltage to the second-generation memory device;
in response to the external programming voltage, pumping a voltage at a control gate of the memory cell directly to a programming voltage level from a first voltage level without stopping at an intermediate voltage level to verify whether the memory cell is already programmed;
pumping a voltage at a drain of the memory device from a first drain voltage level to a second drain voltage level while the voltage at the control gate is at the programming voltage level for programming the memory regardless of whether the memory cell is already programmed.

34. The method of claim 33, further comprising discharging the voltage at the control gate from the programming voltage level to a discharged voltage level and removing the voltage pulse from the drain.

35. The method of claim 34, further comprising pumping the voltage at the control gate from the discharged voltage level to the intermediate voltage level.

36. The method of claim 35, further comprising determining whether the memory cell is programmed, after pumping the voltage at the control gate from the discharged voltage level to the intermediate voltage level, while the control gate is at the intermediate voltage level.

37. The method of claim 36, further comprising discharging the voltage at the control gate to the first voltage level from the intermediate voltage level if the memory device is programmed.

38. The method of claim 36, further comprising applying another voltage pulse to the drain while pumping the voltage at the control gate from the discharged voltage level to the programming voltage level if the memory device is not programmed.

* * * * *

UNITED STATES PATENT AND TRADEMARK OFFICE
CERTIFICATE OF CORRECTION

PATENT NO.       : 6,925,011 B2
APPLICATION NO.  : 10/329792
DATED            : August 2, 2005
INVENTOR(S)      : Pekny et al.

Page 1 of 1

It is certified that error appears in the above-identified patent and that said Letters Patent is hereby corrected as shown below:

Column 6, Line 7, replace "floating-gale" with --floating gate--

Signed and Sealed this

Eighth Day of August, 2006

JON W. DUDAS
*Director of the United States Patent and Trademark Office*